(12) United States Patent
Weyerman

(10) Patent No.: US 6,581,277 B2
(45) Date of Patent: Jun. 24, 2003

(54) WORKPIECE MOVING METHODS

(75) Inventor: Morley J. Weyerman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/067,967

(22) Filed: Feb. 6, 2002

(65) Prior Publication Data

US 2002/0069522 A1 Jun. 13, 2002

Related U.S. Application Data

(62) Division of application No. 09/418,090, filed on Oct. 14, 1999, now Pat. No. 6,405,430, which is a continuation of application No. 09/146,702, filed on Sep. 3, 1998, now Pat. No. 6,029,329, which is a division of application No. 08/598,148, filed on Feb. 7, 1996, now Pat. No. 5,907,902.

(51) Int. Cl.[7] ................................................ H01R 43/00
(52) U.S. Cl. ......................... 29/827; 29/564.6; 29/566.3
(58) Field of Search ................................ 29/827, 564.6, 29/566.3, 825, 883, 832

(56) References Cited

U.S. PATENT DOCUMENTS 4,516,673 A  *  5/1985  Kashihara et al.
4,624,358 A  * 11/1986  Satou

* cited by examiner

*Primary Examiner*—Carl J. Arbes
(74) *Attorney, Agent, or Firm*—Kirkpatrick & Lockhart LLP

(57) ABSTRACT

A method of processing a leadframe strip defining a first row of alignment holes and a second row of alignment holes. One embodiment of the method comprises allowing incremental advancement of said leadframe strip using said first row of alignment holes and refraining from using said second row of alignment holes to allow said advancement.

10 Claims, 5 Drawing Sheets

WORKPIECE MOVING METHODS

CROSS-REFERENCE TO RELATED APPLICATIONS

This application is a division of U.S. patent application Ser. No. 09/418,090 filed Oct. 14, 1999 and issued as U.S. Pat. No. 6,405,430, which is a continuation of U.S. patent application Ser. No. 09/146,702 filed Sep. 3, 1998 and issued as U.S. Pat. No. 6,029,329, which is a division of U.S. patent application Ser. No. 08/598,148 filed Feb. 7, 1996 and issued as U.S. Pat. No. 5,907,902.

BACKGROUND

1. Field of the Invention

The present invention relates generally to the continuous handling of material for processing. More particularly, the present invention relates to a belt feed machine for trimming and forming leads on semiconductor electrical components.

2. Description of the Invention Background

Solid state electrical devices are typically connected to other devices, as well as common substrates, such as printed circuit boards, through the use of electrical connectors, or leads, that are attached to input and output contacts on the device. The quality of the electrical connections between the devices depends upon the proper formation and positioning of the leads and the proper placement of the device.

The individual electrical devices are typically mass produced on common semiconductor substrate, or wafer, which is subsequently cut up to separate the individual dies. Electrical leads are attached to the dies as part of a preformed lead frame in which the leads are flat members extending from a common paddle. The leads are subsequently trimmed from the lead frame and formed to the desired shape after attachment to the die. Lead frames are often produced as a series of individual frames, each containing electrical leads for attachment to a die. The formation of multiple devices in a single lead frame or strip provides for easier handling of the lead frame during processing. In addition, the lead frames typically contain indexing holes for use in handling and alignment of the lead frame during subsequent processing. After the leads are attached, the devices are typically encapsulated in a molding compound to protect the device from moisture and other deleterious environmental conditions. The lead frames also contain dambars that are attached perpendicularly to the leads to provide structural support to the leads during processing and to prevent molding compound that extrudes from the mold during the encapsulation, known as flashing, and accumulates between the leads from flowing onto the portion of the leads to be attached to another component or onto adjacent devices.

After the plastic encapsulation of the device, the flashing and the dambars must be removed from between the leads. In addition, the electrical leads must be disconnected from the lead frames, trimmed and formed to a desired shape. Finally, the individual devices must be separated from the lead frame to yield the finished product. Each of these processes is generally performed through the use of die and punch tooling.

In the prior art, specially dedicated machines were used to perform each of the die and punch operations. The strips of lead frames would be processed in one machine for a given step and then transported to another machine to further processing. However, the transporting of the strips between machines and the required overhead with loading and feeding strips to the machines greatly increased the processing time and lowered the yield of the devices due to higher incidence of damage. Many of the problems with the use of the individual machines were overcome with development of integrated machines that can be used to perform a series of tooling operations on the framed device in one machine. In those machines, the die and punch tooling operations are linearly arranged in tooling stages and the frames are moved serially through each tooling operation.

The integrated machines use a "walking beam" method to advance the frames through the various stages. In a walking beam method, the strip is horizontally oriented and fed into a track at the inlet of the machine until the indexing holes which the initial position of the first finger of the walking beam and are engaged from above by the first set of pins extending from the first finger. The track supports the frame while leaving both sides of the device exposed and guides the strip through the machine as the strip is advanced by the fingers of the walking beam. Actuation of the beam causes the finger to move the lead frame to the first tooling stage. In the tooling stages, the punch tooling is reciprocated to contact and push the lead frame from above so as to disengage the lead frame from the pins on the walking beam finger and to push the lead frame onto the alignment pins attached to the stationary die. Once the lead frame is seated with the alignment pins in the indexing holes, the punch tooling stroke is continued to perform the tooling operation on the device. After the punch tooling disengages the lead frame from the walking beam finger pins, the finger is reciprocated back to its initial position where the pins on the finger engage the next pair of indexing holes in the lead frame, while during the punch operation is occurring. After the punch operation is completed, the punch tooling is reciprocated away from the stationary die and the track and lead frame lift off of the alignment pins on the stationary die. The walking beam finger is then actuated to advance the next frame into the tooling stage, which advances the preceding frame into the next tooling stage. In the final step, the devices are removed, or singulated, from the frames and the frames are discarded. While the use of the walking beam has provided a significant improvement over the prior art, the overall throughput of the machines is limited by the number of times that the strip must be engaged and disengaged by the walking beam pins, which is one of the most time consuming operation during processing. Also, the necessary reciprocal motion of the actuator results in a significant amount of unnecessary machine operations that can affect the long term reliability of the machine. Additionally in the walking beam method, the punch tooling is reciprocated not only to bring the punch into contact with the device, but to align and drive the device into the die tooling. This procedure significantly increases the stroke length of the punch, thereby increasing the possibility of damaging the devices, in addition to potentially causing tooling alignment difficulties due to bending of the frames and/or track.

Some of the problems associated with the unnecessary machine motion and potential overstroke of the punching tooling are resolved with the development of the pinch roller advance machines. The pinch roller machine advances the strip in a vertically oriented position through the use of a series of pinch rollers that contact the edges of the lead frame. The only advancement operation performed by the pinch roller machine operation is the rotation of the pinch rollers to advance the strip, thereby eliminating the unnecessary reciprocal operations associated with the walking beam method. Additionally, the pinch roller machine provides for reciprocal movement of both the punch and die tooling so as to reduce or eliminate many of the problems associated with the movement of only the punch tooling in the walking beam method. However, a limitation the pinch roller method is that the rollers must still be disengaged to some extent in each tooling stage to allow the alignment of the lead frame on the alignment pins of the die tooling prior to performing the tooling operation. Unlike the walking beam method, the disengagement of the strip by the rollers and the alignment of the frame on the die are not inherently interrelated operations, and therefore, must be synchronized to operate correctly, such as through the use of computer controller. The same is true after the completion of the tooling operation and the reengagement of the strip by the pinch rollers. As is the case with the walking beam method, these operations are a critical path operation and tend to limit the throughput of the machines. In addition, the performance of the pinch rollers must be closely monitored to ensure that the rollers do not apply excessive compressive forces on the lead frame during movement of the strip that may tend to damage frame, but that sufficient force is applied to prevent the strip from slipping during rotation of the roller that will cause a misalignment condition.

The present invention is directed to continuous belt feed design which overcomes, among others, the above-discussed problems so as to allow machines that commonly use walking beam transfer arrangements to provide for increased throughput capacities by eliminating the unproductive and time consuming machine operations that are required to reciprocate the walking beam apparatus back into position prior to handling subsequent devices.

SUMMARY OF THE INVENTION

The above objects and others are accomplished by a belt feed apparatus in accordance with the present invention. The apparatus includes at least two rotatable pulleys, an endless belt capable of retaining devices to be processed is disposed around the pulleys such that rotation of the pulleys will cause said belt to travel around said pulleys, and a plurality of paired tooling members, each of said paired tooling members having first and second tooling members disposed on opposing sides of the belt and directly opposing so as to cooperate and perform a tooling operation on the leads when reciprocated toward each other along a common axis. In a preferred embodiment, two horizontally aligned pulleys with vertical axes of rotation are used to rotate the belt in a horizontal plane and the first and second tooling member are reciprocated by a common cam and the rotation of the belt and the reciprocation of the tooling members are synchronized. Alternatively, the first and second members can be driven by different cam drives that are synchronized in conjunction with the rotation of the pulleys.

Accordingly, the present invention provides significant increase in the efficiency of handling devices during sequential operations. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF THE PREFERRED EMBODIMENTS

Figure 1:
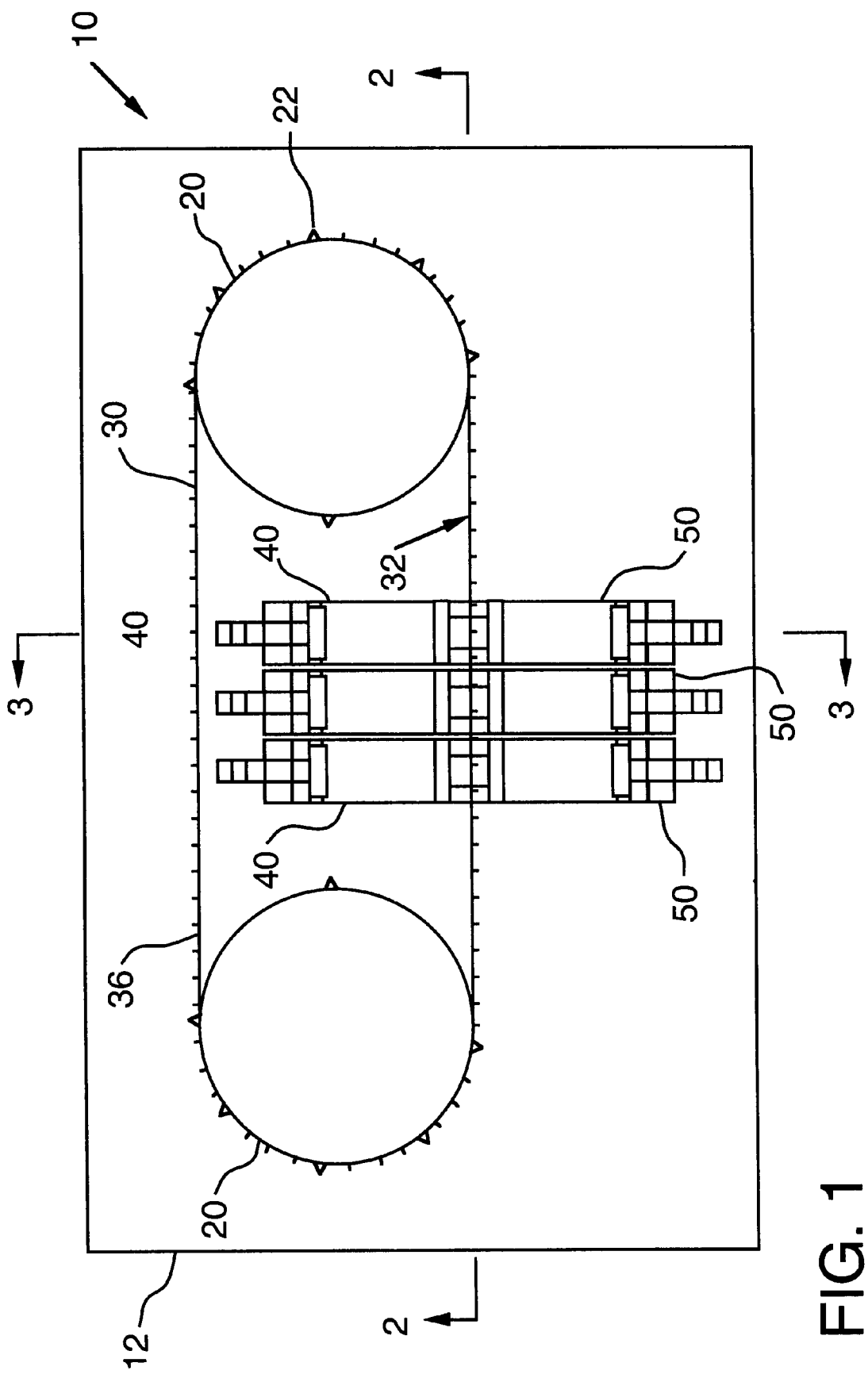
FIG. 1 is a top view of the apparatus showing three pairs of tooling members.

The operation of the apparatus 10 will be described generally with reference to the drawings for the purpose of illustrating present preferred embodiments of the invention only and not for purposes of limiting the same. In accordance with the present invention, an endless belt 30 is disposed around the periphery of at least two horizontally aligned pulleys 20 having vertical axes of rotation. A series of directly opposed first and second tooling members, 40 and 50, respectively are disposed on opposite sides of the belt 30. Lead frames 98 containing electrical devices 90 having leads 92 are attached to the endless belt 30 and the pulleys 20 are rotated causing the endless belt 30 travel around the pulleys 20 until the lead frames 98 are positioned between the first and second tooling members, 40 and 50, respectively. The first and second tooling members, 40 and 50, respectively are then reciprocated so as to cooperate and perform a tooling operation on the device 90. The pulleys 20 are then rotated to advance the device 90 to the subsequent pairs of tooling members. After the final shape of the device 90 is attained, the device 90 is separated from the frame 98 and the frame 98 is discarded.

Figure 2:
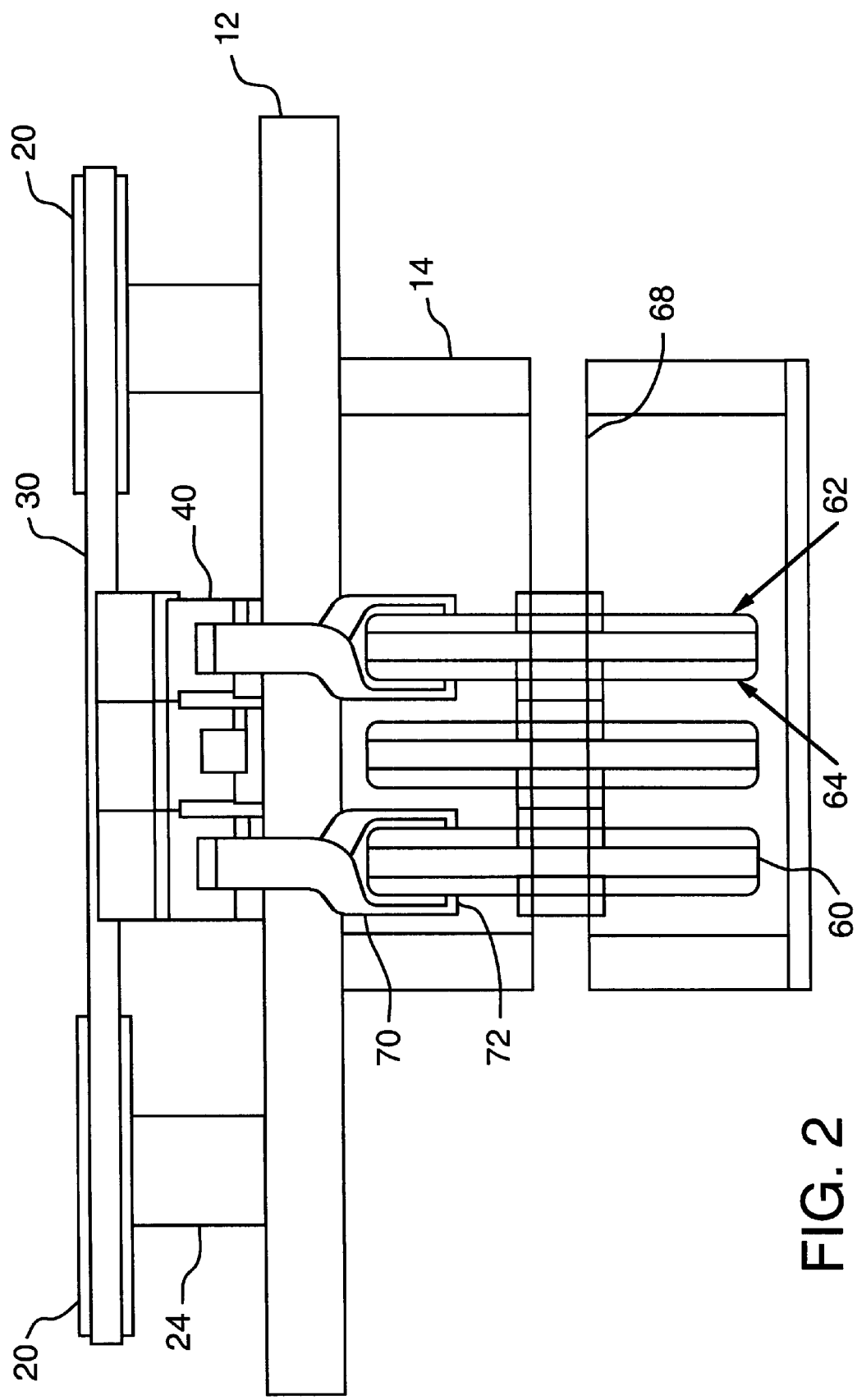
FIG. 2 is a front view of the apparatus along line 2—2 showing three pairs of tooling members.
Figure 3:
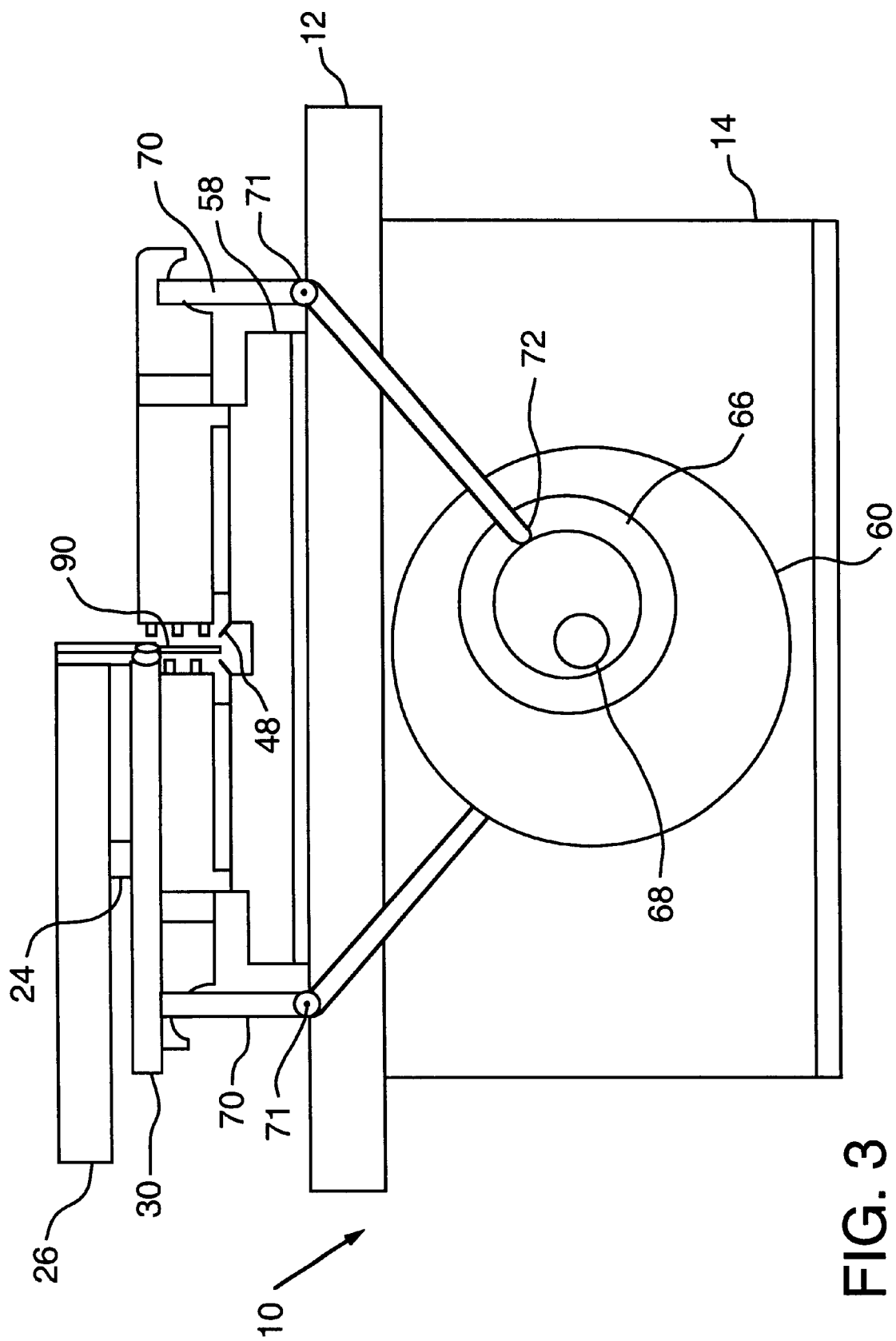
FIG. 3 is a side view of the apparatus along line 3—3 showing a device in position between the tooling members with a top driven pulley and a bottom driven cam.

In a preferred embodiment, two pulleys 20 are mounted on a horizontal bench top 12 with the rotation of the pulleys 20 occurring about the vertical axis 24, either from below or above as shown in FIGS. 2 and 3, respectively. Two pulleys 20 are preferred to minimize the area occupied by the machine ("the footprint") and to provide for linear movement of the devices through the tooling equipment. However, any number of pulleys 20 can be used with the present invention to achieve a desired result, for example, different sized and shaped tooling members can be accommodated by adding pulleys to change the shape of the belt. Preferably, the pulleys 20 are constructed from aluminum and the bench top 12 constructed from steel. Other materials of comparable physical characteristics can be used for the pulleys 20 and bench top 12 of the present invention. The actual dimensions and materials of construction can be varied depending upon the size of the devices to be processed.

Preferably, the pulleys 20 are provided with a series of protrusions 22 that are spaced around the perimeters of the pulleys 20 and are capable of engaging holes in the belt 30 and preventing the belt 30 from slipping when the pulleys 20 are rotated. The protrusions 22 are preferably centered and positioned in 45.degree. intervals around the circumference of the pulleys 20 and constructed of a hard tool steel grade to insure accuracy and long life; however, the design, location, and materials of construction of the protrusions can be varied by the skilled practitioner to achieve a desired result.

The endless belt 30 is preferably constructed of stainless steel or other suitable material and has a circumferential length of a size suitable to fit securely around the pulleys 20. The belt 30 has opposing faces, a pulley face 32 that contacts the periphery of the pulleys 20 and a device face 34 that contacts the devices 90. The belt has holes 38 through the opposing faces that are preferably centered, sized and spaced to mate with the protrusions 22 on the pulleys 20 as the belt 30 travels around the pulleys. Pins 36 are provided on the device face 34 of the belt to engage the indexing holes 96 and retain the lead frames 98. Alternatively, the pulleys 20 can be oriented with a horizontal axis of rotation and the belt faces 32 and 34 would be horizontal. Preferably, a track 48 is provided for additional alignment and support for the bottom portion of the frame 98 when the frame 98 is attached to the belt 30. Preferably, a high torque stepper servomotor is used to rotate the pulleys 20 and to provide precise stop and start control of the belt 30. A pulley housing 26 can also be incorporated to protect the pulleys 20 and the belt 30 from accidental disruption during operation.

A plurality of paired first and second tooling members, 40 and 50, respectively, are disposed on opposing sides, 32 and 34, respectively of the belt 30. In a preferred embodiment, each pair of tooling members are reciprocally attached to the horizontal bench top 12 in a directly opposed configuration on a monorail barrel roller assembly 58, which is preferably provided for increased alignment accuracy and loading capability. The first and second tooling members, 40 and 50, respectively, have opposing tooling faces 42 and 52, respectively, which are designed to cooperate to perform a desired tooling operation on the devices 90, when the faces are placed in close proximity by reciprocating the first tooling member 40 and the second tooling member 50 toward one another. In a preferred embodiment, the first tooling members 40 and second tooling members 50 are die and punch tooling, respectively. The actual number of paired tooling members, or stages, and the design of the tooling faces 42 and 52, respectively, is dependent on the final design of the leads 92 as well as the shape of the leads 92 when fed into the apparatus 10. FIGS. 1 and 2 show one possible arrangement of three paired tooling members. Additional discussion on the number of stages and the tooling is provided below by way of example.

In a preferred embodiment, each of the paired tooling members 40 and 50, respectively, are reciprocated in opposite directions along the common rail 58 by a single cam 60 having first and second cam faces, 62 and 64, respectively. The cams 60 for each tooling stage are driven by a common camshaft 68, which provides for synchronization of the devices 90 in each tooling stage. A trough 66 is provided in each of the cam faces, 62 and 64, respectively, for conversion of the rotational motion of the cam 60 into reciprocal motion of the tooling members, 40 and 50, respectively. A lever arm 70 connects the cam 60 and the tooling members 40 and 50, respectively. The lever arm 70 has a cam end 72 that rides in the trough 66 of the cam 60. The lever arm 70 is mounted on the bench top 12 using a sturdy bearing assembly 71 that creates an axis about which the arm could pivot such that when the cam end 72 moves within the trough 66 the lever arm 70 and the tooling members, 40 and 50, respectively, reciprocate a fixed distance relative to the amount of the displacement of the cam end 72. Substantially simultaneous reciprocation of the tooling members 40 and 50 is achieved through the use of complimentary troughs 66 in the first and second cam faces, 62 and 64. The attachment of a first lever arm 70 between the first cam face 62 and the first tooling member 40 and the attachment of a second lever arm 70 between the second cam face 64 and the second tooling member 50 allow the motion of the tooling members, 40 and 50, to be commonly controlled. Preferably, the tooling members, 40 and 50, are spaced equidistant from the location of the devices 90 and the troughs 66 are complimentary so as to provide for minimal translation of the tooling members, 40 and 50. However, it will be appreciated that the relative translation of each tooling member, 40 and 50, respectively, and the timing of the movements can be varied by changing the design of the trough 66 in each of the cam faces 62 and 64, respectively. Also, the cams 60 and the cam shaft 68 are preferably positioned below the horizontal bench top 12 in a cam housing 14 and the lever arms 70 pass through the bench top 12 in order to provide a more compact arrangement of the components. Alternatively, the cams 60 and camshaft 68 can be mounted on the bench top 12 in a linear arrangement. Preferably, a three phase servomotor with a gear reducer and a clutch/brake device is used to provide precise start and stop control over the turning of the cam shaft 68; however, other methods of precisely controlling the turning of the cam shaft 68 may be used in the present invention.

Figure 4:
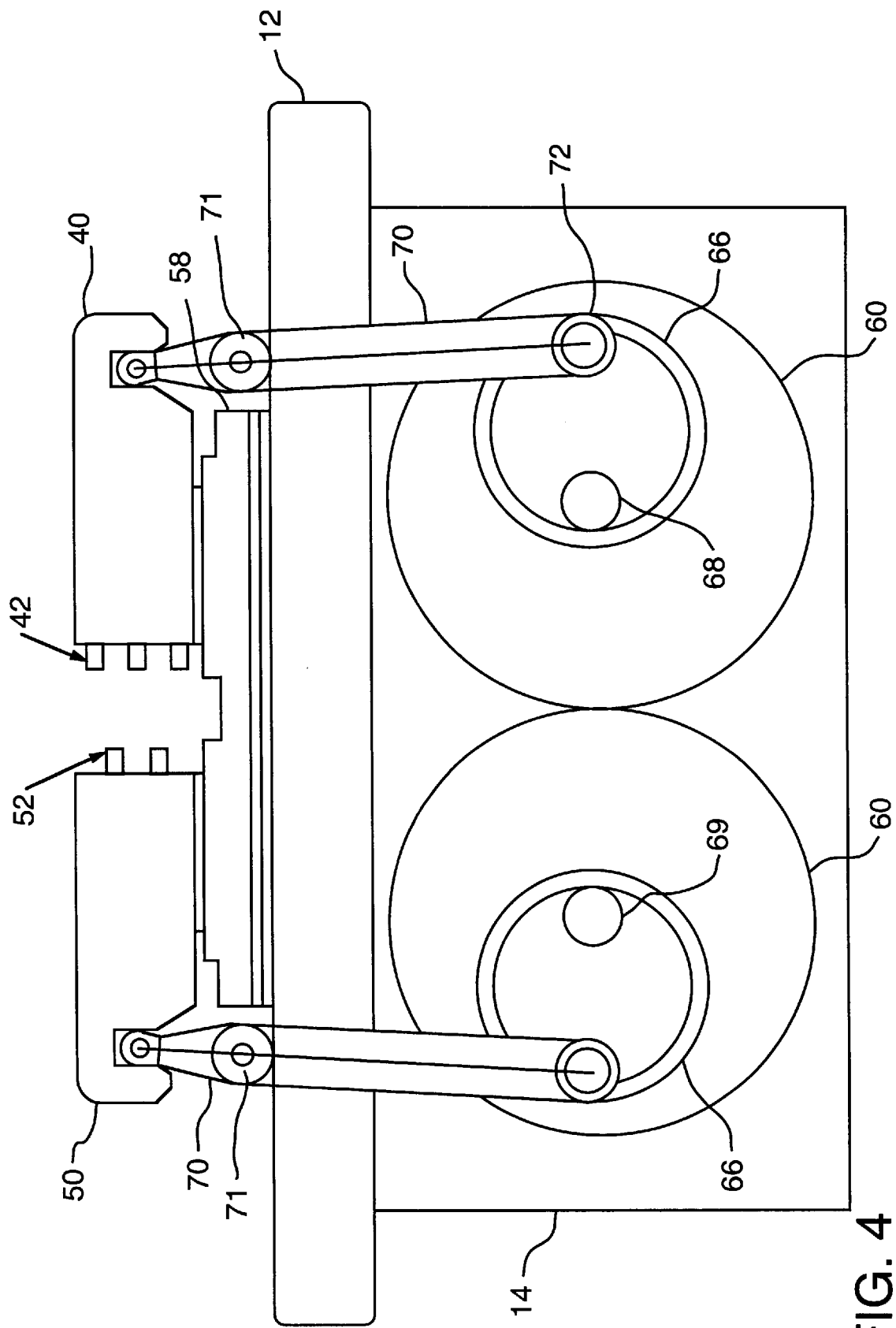
FIG. 4 is a side view of the apparatus comparable to FIG. 3 showing an alternative cam embodiments without the pulleys and belt; and, FIG. 5 is a front view showing a 20-lead device in a frame attached to the device side of the belt.

In an alternative cam embodiment, as shown in FIG. 4, the first tooling member 40 and the second tooling member 50 are driven by separate camshafts, 68 and 69, respectively. The relative movement of the first and second tooling members, 40 and 50, respectively, can be synchronized by the use of a common servomotor in conjunction with 90-degree gears connecting camshaft 68 with camshaft 69 or through the use of separate servomotors that are synchronized in some manner, such as with a computer.

Also in a preferred embodiment, a computer is used to provide synchronized control over both the pulley servomotor and the cam servomotors. In addition, alignment sensors can be positioned on the respective tooling members, 40 and 50, to be used in conjunction with the holes 38 in the belt 30 and tied into the computer to ensure the proper alignment of the device 90 in the tooling stage prior to movement of the tooling members, 40 and 50, respectively. The anticipated speed of processing devices 90 is approximately 3 to 4 strokes/second as compared to a speed of approximately 1 stroke/second using the prior art methods.

Figure 5:
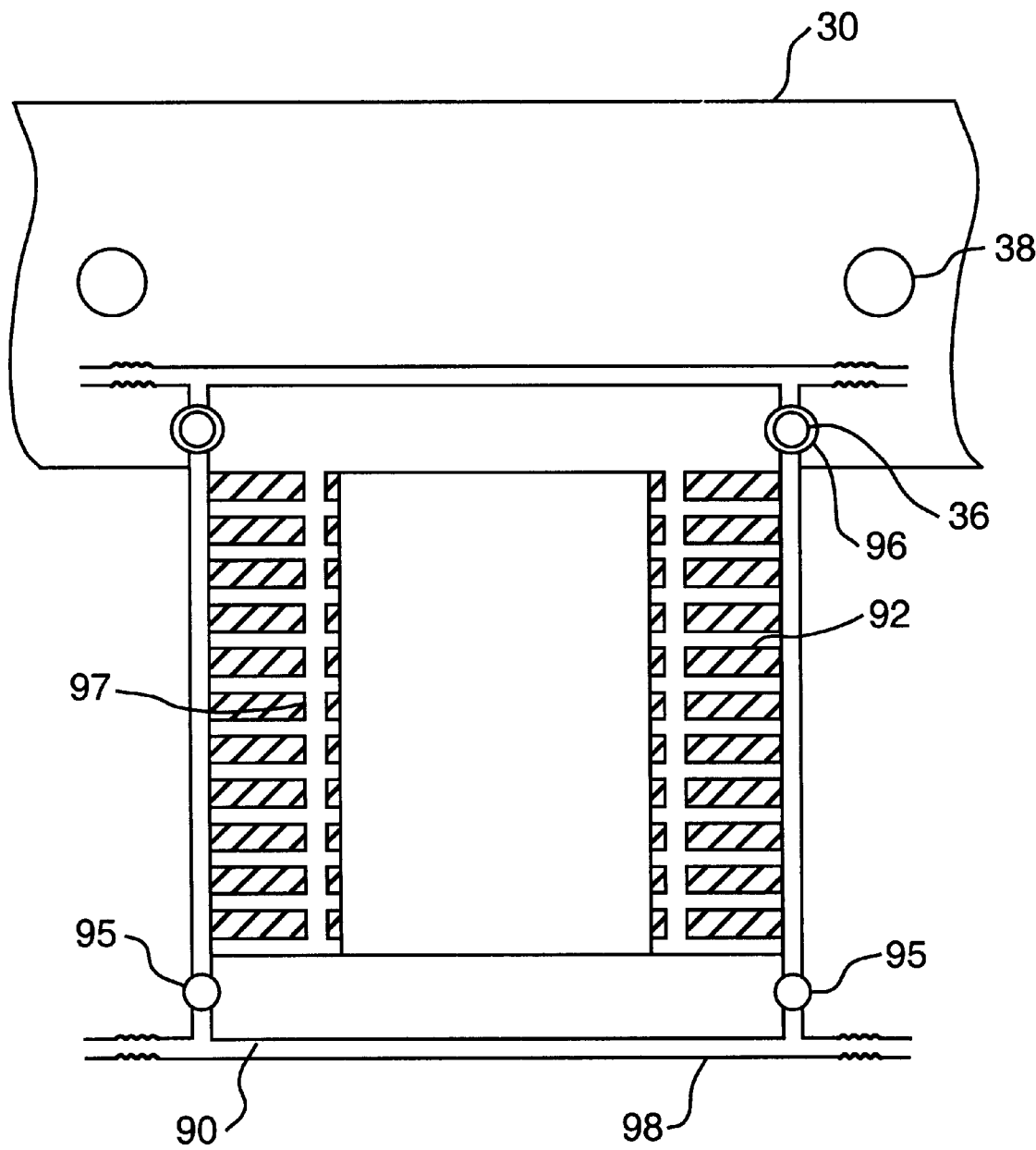

An example of the use of the apparatus of the present invention will be described with respect to the trimming and forming of a 20-lead device as shown in FIG. 5. In a preferred embodiment for processing the 20-lead device to have J-shaped leads, the pulleys 20 are preferably 5.5 inches in diameter having an axial length of 1.0 inch and constructed from aluminum and spaced apart with approximately 15.0 inches between the axes of rotation. The belt 30 is constructed of ¾ inch wide by 10 mil thick stainless steel. Seven paired tooling members are positioned on opposing sides of the belt 30 and spaced in ¾ inch intervals to perform the tooling operations on the devices. Lead frames 98 containing the devices 90 are fed to the apparatus be conventional methods and are attached to the pins 36 on the belt 30 through the ovular shaped indexing holes 96 in the top portion of the lead frames 98. The bottom portion of the lead frame 98 is engaged in the track 48. The pulleys 20 are rotated to cause the belt 30 to travel bringing the lead frame 98 to the first tooling stage in which the die and punch tooling has been designed to remove the flashing from between the leads 92. The die and punch tooling is reciprocated toward the device and the alignment pins on the die tooling engage the circular indexing holes 95 in the bottom portion of the lead frame 98. The precise alignment of the lead frame 98 in the die is accommodated without disengaging the lead frame 98 by incremental slide of the ovular shaped indexing holes 96 on the pins 36. The pulleys 20 are again rotated to move the belt 30 and the lead frame 98 to a second tooling stage where the dambars 97 which are used to provide additional structural support to the lead frame 98 and to prevent the flow of molding compound onto other devices are punched out of the lead frame 98. The lead frame 98 is then advanced to the next tooling stage where the leads 92 are trimmed to the proper length. The lead frames 98 are then advanced through a series of four forming operations in which the free end of the leads are first bent approximately 90-degree with respect to the end of the lead attached to the device 90 toward the bottom side of the device 90. The leads 92 are then bent near the attached end approximately 90-degree toward the bottom side of the device 90 after which the free end of the leads 92 are again bent so that the free end faces the bottom surface of the device 90. Finally, the leads 92 is bent toward the bottom surface of the device 90 until the free end of the device 90 is in a close proximate relation with the bottom surface of the device 90. After this final forming step, the device is singulated from the lead frame 98 by punching the device 90 out of the lead frame 98. The lead frame 98 can then be discarded.

Those of ordinary skill in the art will appreciate that the present invention provides tremendous advantages over the current state of the art for efficient handling of material through staged processing. In particular, the present invention provides for a continuous feed of lead frames containing electrical devices to a trim and form machine. Also, the present invention allows for short stroke lengths of the punch and die tooling. Thus, the present invention provides a effective method of increasing the capacity of machines used to perform material handling applications. While the subject invention provides these and other advantages over the prior art, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. A method of processing a leadframe strip defining a first row of alignment holes and a second row of alignment holes, said method comprising:
   allowing incremental movement of said leadframe strip relative to a leadframe advancer using said first row of alignment holes; and
   refraining from using said second row of alignment holes to allow said incremental movement.

2. The method in claim 1, wherein said allowing incremental movement comprises penetrating at least one hole of said first row of alignment holes with at least one protrusion from the leadframe advancer.

3. The method in claim 2, further comprising:
   moving said leadframe strip proximate to a tool; and
   penetrating at least one hole of said second row of alignment holes with a protrusion from said tool.

4. The method in claim 3, further comprising guiding said incremental movement with a track encompassing a side of said strip.

5. The method of claim 3, further comprising performing a tooling function on a component of said leadframe strip with said tool.

6. The method in claim 5, wherein said performing a tooling function comprises removing flashing.

7. The method in claim 5, wherein said performing a tooling function comprises punching said component out of said leadframe strip.

8. The method in claim 5, wherein said performing a tooling function comprises trimming said component.

9. The method in claim 5, wherein said performing a tooling function comprises performing a forming operation.

10. The method in claim 9, wherein said performing a forming operation comprises bending a lead of said component.

* * * * *